United States Patent
Chung et al.

(10) Patent No.: US 7,434,117 B1
(45) Date of Patent: Oct. 7, 2008

(54) METHOD AND APPARATUS OF DETERMINING BAD FRAME INDICATION FOR SPEECH SERVICE IN A WIRELESS COMMUNICATION SYSTEM

(75) Inventors: Pei-Shiun Chung, Taipei Hsien (TW); Wei-Nan Sun, Hsin-Chu Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 396 days.

(21) Appl. No.: 11/163,723

(22) Filed: Oct. 28, 2005

(51) Int. Cl.
- *G06F 11/00* (2006.01)
- *G06F 1/00* (2006.01)
- *H03M 13/00* (2006.01)
- *G10L 19/00* (2006.01)

(52) U.S. Cl. .................. 714/704; 714/746; 704/219

(58) Field of Classification Search ............. 714/704, 714/752, 747; 704/219
See application file for complete search history.

(56) References Cited

U.S. PATENT DOCUMENTS

| | | | | |
|---|---|---|---|---|
| 5,557,639 A | * | 9/1996 | Heikkila et al. | 375/224 |
| 5,815,507 A | * | 9/1998 | Vinggaard et al. | 714/704 |
| 5,901,186 A | * | 5/1999 | Jamal et al. | 375/346 |
| 5,936,979 A | * | 8/1999 | Jyrkka | 714/763 |
| 5,952,968 A | * | 9/1999 | McDowell | 342/383 |
| 6,097,772 A | * | 8/2000 | Johnson et al. | 375/346 |
| 6,243,568 B1 | * | 6/2001 | Detlef et al. | 455/226.4 |
| 6,298,084 B1 | * | 10/2001 | Vinggaard et al. | 375/224 |
| 6,775,521 B1 | * | 8/2004 | Chen | 455/67.11 |
| 6,941,150 B2 | * | 9/2005 | Taori et al. | 455/502 |
| 2005/0048923 A1 | * | 3/2005 | Mohseni et al. | 455/67.11 |

* cited by examiner

*Primary Examiner*—Cynthia Britt
*Assistant Examiner*—Daniel F McMahon
(74) *Attorney, Agent, or Firm*—Winston Hsu

(57) ABSTRACT

A method of operating a receiver to determine a bad frame indication (BFI) of a received speech block includes decoding speech information bits of the received speech block; re-encoding the decoded speech information bits; comparing the received speech information bits with the corresponding decoded and re-encoded speech information bits to calculate a number of erroneous bits; determining a mode information of the received speech block; calculating a signal quality measurement of the received speech block; calculating a block quality metric according to the mode information, wherein the block quality metric is related to both the number of erroneous bits and the signal quality measurement; and setting the BFI of the received speech block according to the block quality metric.

21 Claims, 8 Drawing Sheets

METHOD AND APPARATUS OF DETERMINING BAD FRAME INDICATION FOR SPEECH SERVICE IN A WIRELESS COMMUNICATION SYSTEM

BACKGROUND

The invention relates to a bad frame indication of speech blocks in a wireless digital communication system, and more particularly, to a method and apparatus of determining the bad frame indication of speech blocks for identifying bad blocks received in a voice transmission in a wireless digital communication system.

The Global System for Mobile Communications (GSM), one of the most popular prevailing digital communication systems, provides speech service over a wireless environment. But the speech information, which is generated by digitizing and compressing the voice waveform, can be corrupted by severe fading conditions, which in turn causes the received speech blocks to become corrupted. Also, discontinuous transmission capability is activated if the speaking voice is inactive during the call. At the receiving side, each received block may contain corrupted or useless information for voice synthesis. This kind of corrupted or useless block needs to be marked as bad to notify the speech processing so as to prevent erroneous decoding, which would lead to annoying audio effects being generated for the listener.

Thus, the bad frame indication (BFI) decision is to recognize both the bad speech and the non-speech blocks as 'bad' ones effectively. Then these bad frames can be erased through error concealment. The traditional method for determining the BFI is based on the CRC result only. That means if the checksum of CRC is not equal to zero, the speech frame is considered to be bad. Unfortunately, in practice, the length of CRC parity bits is not long enough in GSM applications. And, in the fading environment, the speech block could be corrupted. In the speech decoder, the corrupted speech information leads to the unpleasant noise and degrades the speech quality severely. For example, if the Discontinuous Transmission (DTX) is regarded as a useful speech block, the clipping effect causes the listener to experience unpleasant noise. Therefore, some other strategies for combating bad and lost speech frames, such as error concealment, muting, and substitution, are needed.

SUMMARY

Methods and apparatuses for determining a bad frame indication of a received speech block are provided. An exemplary embodiment of a method of operating a receiver to determine a bad frame indication (BFI) of a received speech block includes estimating the number of erroneous bits of the received speech block; determining a mode information of the receiver; calculating a current signal quality measurement of the received speech block; calculating a block quality metric according to the mode information, wherein the block quality metric is related to both the number of erroneous bits and the signal quality measurement; and setting the BFI of the received speech block according to the block quality metric.

An exemplary embodiment of a mobile station receiver for determining a BFI of a received speech block includes an error calculation circuit for estimating the number of erroneous bits of the received speech block; a signal quality calculation circuit for calculating a current signal quality measurement of the received speech block; and a BFI determining circuit for determining a mode information of the received speech block; for calculating a block quality metric according to the mode information, wherein the block quality metric is related to both the number of erroneous bits and the signal quality measurement; and for setting the BFI of the received speech block according to the block quality metric.

DETAILED DESCRIPTION

Figure 1:
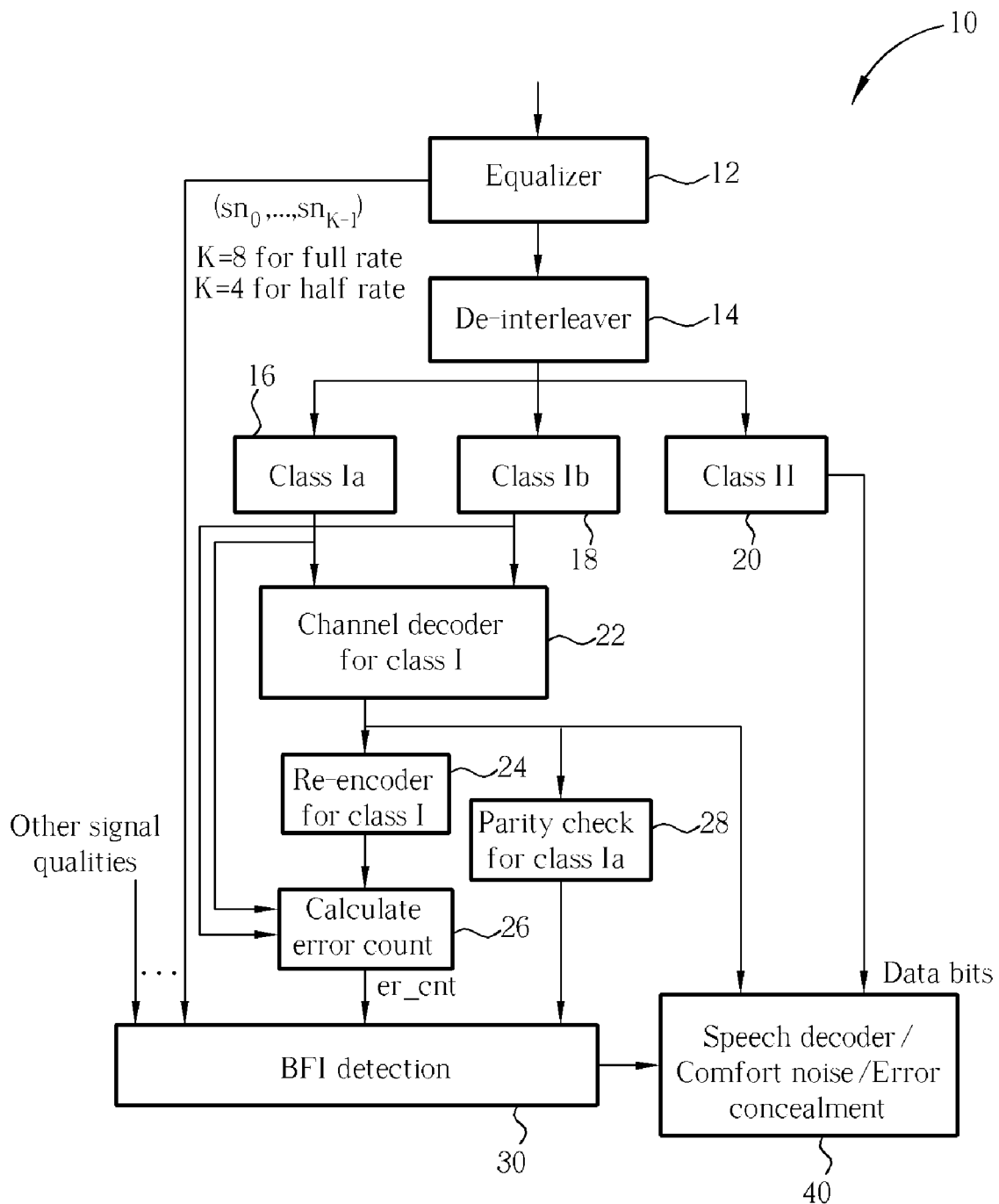
FIG. 1 is a block diagram illustrating a basic receiver structure for performing BFI detection in wireless communication.

Please refer to FIG. 1, which illustrates a block diagram of the basic structure of a mobile station receiver 10 for performing BFI detection in wireless communication. The receiver 10 contains an equalizer 12 for equalizing the multipath data for reducing inter-symbol interference (ISI). The equalized data is then output to a de-interleaver 14 for gathering the interleaved copies of data into a useable format. The speech information bits of a received speech block can then be sorted into class Ia speech bits 16, class Ib speech bits 18, and class II speech bits 20. Then class Ia speech bits 16 and class Ib speech bits 18 are then decoded by a channel decoder 22. The decoded bits are output to a re-encoder 24 for re-encoding the decoded class I bits. These decoded and re-encoded bits are compared to the output of the de-interleaver 14 and the sum of number of mismatched bits is calculated by an error calculation circuit 26. The number of erroneous bits counted is denoted as er_cnt. In this embodiment, depending on the importance of parameters in each block, the speech information bits are classified as class Ia, class Ib, and class II bits according to the influence on the speech quality. The most important bits are classified as class Ia bits, the next most important bits as class Ib bits, and the least important bits as class II bits. The different class bits are protected by different schemes. However, it should be noted that ways to classify received speech block should not be a limitation to the present invention.

Another measure for determining the BFI of received speech block is based on a current signal quality measurement of the received speech block. Many kinds of information can be used to reflecting the signal quality, such as the signal-to-noise ratio (SNR), the soft output of the equalizer, and the power of estimated channel coefficients. The better the quality, the fewer the errors there will be in speech blocks. Here SNR will be used as an example to illustrate the idea. The SNR can be calculated by various algorithms. One common method is based on the training sequence. The channel coefficients can be estimated by the training sequence. Then the signal part of the received signal can be reconstructed. By subtracting the reconstructed signal from the received signal, the noise signal and corresponding noise power level are obtained. The SNR can be acquired by dividing the signal power by the noise power. Because the signal quality is calculated burst by burst, we can get several signal quality values for one speech block, denoted as $(sn_0, \ldots, sn_{K-1})$, where K=8 for full rate and K=4 for half rate speech service.

After some calculation for these signal quality values, we can get an effective signal quality, denoted as SNR. Other signal quality measures for each burst, denoted as $(sq_0, \ldots, sq_{K-1})$, also can be used for BFI decision. For example, the reciprocal of equalizer accumulated path metric is a good signal quality measure.

A parity checking circuit 28 determines the CRC results for class Ia speech bits 16. Then a BFI detection circuit 30 determines the BFI result for the current speech block based on the CRC, the SNR, the number of erroneous bits er_cnt, and any other preferred signal quality measures. Finally, the result of BFI detection is delivered to a speech processing unit 40. The speech processing unit 40 will determine which procedure is applied based on the BFI result, such as decoding the speech block, generating comfort noise, or concealing the error.

Figure 2:
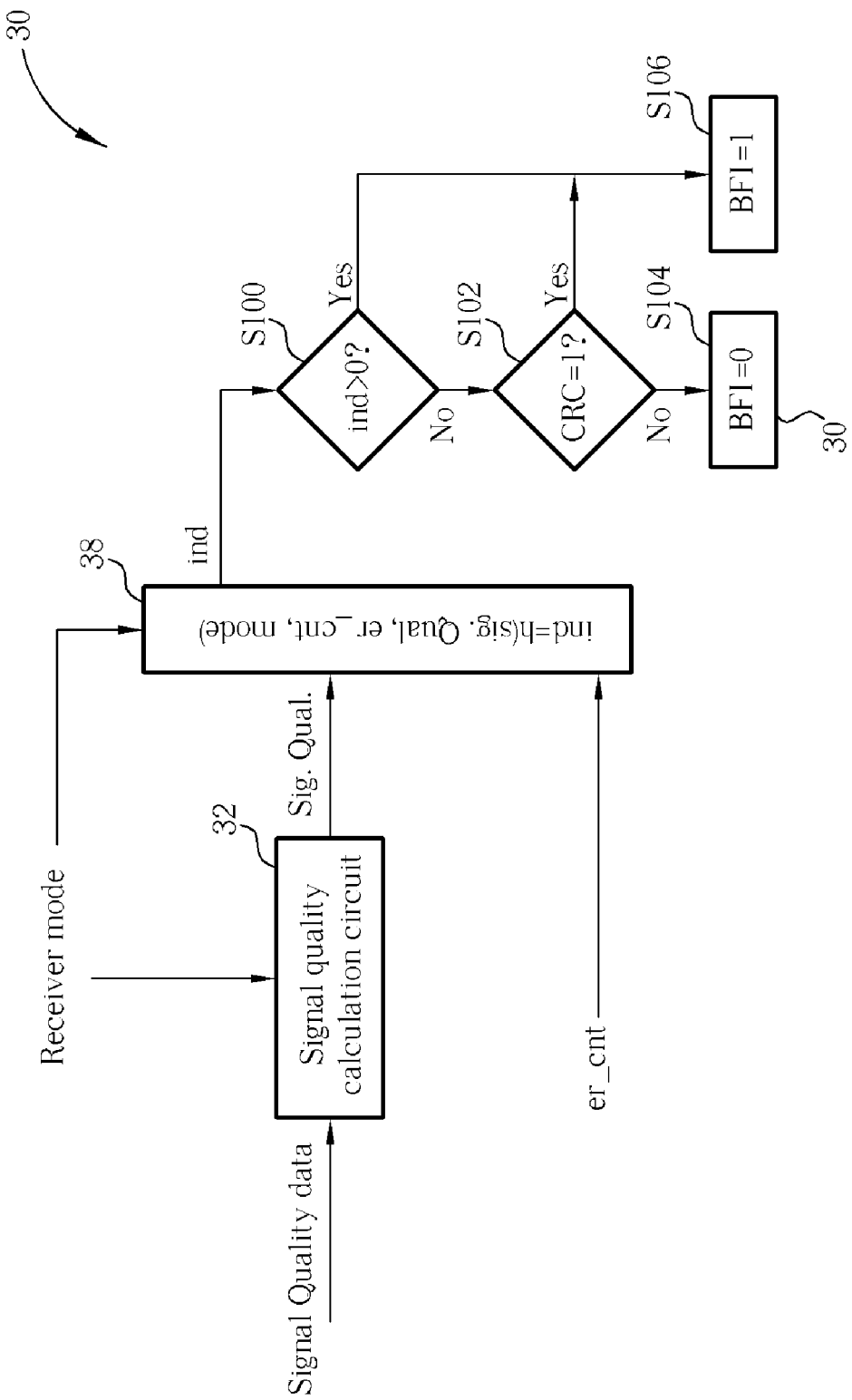
FIG. 2 is a general block diagram illustrating a BFI detection circuit.
Figure 3:
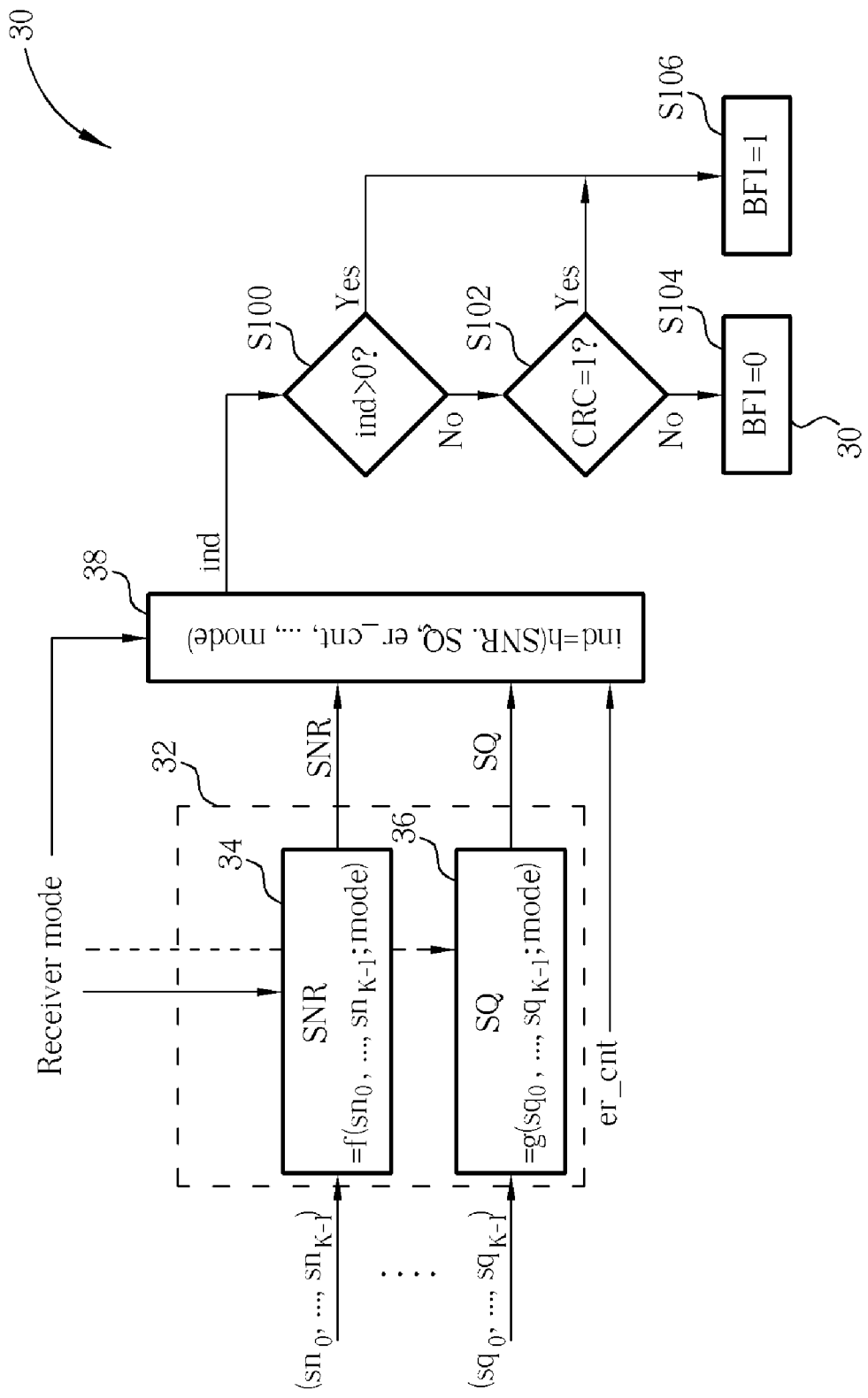
FIG. 3 is a detailed block diagram illustrating the BFI detection circuit.

Please refer to FIG. 2 and FIG. 3. FIG. 2 is a general block diagram illustrating the BFI detection circuit 30 shown in FIG. 1, and FIG. 3 provides a more detailed block diagram of the BFI detection circuit 30. The BFI detection circuit 30 contains a signal quality calculation circuit 32 for generating a current signal quality measurement of the received speech block and a BFI determining circuit 38 for calculating a block quality metric "ind" according to the number of erroneous bits er_cnt, a detected mode information of the receiver 10, and the current signal quality measurement outputted by the signal quality calculation circuit 32. Once the CRC value and the block quality metric ind are determined, the BFI for the current speech block is determined. As shown in steps S100 to S106, if the block quality metric ind is greater than zero (which represents that the speech block has a poor quality metric) or the CRC result is failed (CRC=1) then the received block is considered to be bad, and the BFI value is set to 1. Otherwise, if the block quality metric ind is less than or equal to zero and the CRC value is equal to zero, then the received block is considered to be good, and the BFI value is set to 0.

While FIG. 2 only generally illustrates that the signal quality calculation circuit 32 outputs a current signal quality measurement, FIG. 3 gives an example in which the signal quality calculation circuit 32 uses different measurements for calculating the current signal quality measurement. SNR input data $(sn_0, \ldots, sn_{K-1})$ and signal quality (SQ) input data $(sq_0, \ldots, sq_{K-1})$ is received by an SNR calculation circuit 34 and a SQ calculation circuit 36, respectively, and a SNR result and a SQ result are calculated according to the mode of the receiver 10, as will be explained below. The SNR result and the SQ result are output to the BFI determining circuit 38, which calculates the block quality metric ind according to the SNR result, the SQ result, the number of erroneous bits er_cnt, and the mode of the receiver 10. Examples of formulas that can be used for calculating the block quality metric ind will be given below. Finally, the BFI value is determined in steps S100 to S106 according to the block quality metric ind and the CRC value.

As mentioned above, the calculation methods of the SNR, the SQ, and the block quality metric ind are based on the mode information, which is prior information used to reflect whether the speech is transmitted or not. Depending on the different techniques and protocols used for the speech channels, the mode information can be determined by predefined markers, which are used to stand for the start or ending of speech transmission, or by other algorithms to decide the transition between speech and silence periods if no explicit information about the mode alternation. The mode information is an important consideration because if the received block is in DTX mode, the block is more likely to be a non-speech frame and the calculation of SNR, SQ, and block quality metric ind should be changed accordingly in order to increase the probability of declaring a bad frame.

The following is an example to generate the BFI determination. The number of erroneous bits er_cnt, the SNR, and the SQ is combined to get the block quality metric ind through a pre-defined function according to the mode information. If the block quality metric ind is regarded as bad or if CRC result is failed, the received speech block is claimed as bad. The function of h(SNR, SQ, er_cnt, mode) depends on different speech channels and chosen signal qualities, and it can be determined by large amount of field trials or simulation results to optimize the partition boundary. For example, we can use a polynomial to fit the optimized boundary for a specific speech channel. Also, the function of h(SNR, SQ, er_cnt, mode) can be adaptively changed based on the mode information. For example, when the current mode occurs during the silence period or non-speech transmission, more bad frames can be declared by changing the function h and its corresponding parameters, which are the coefficients of the polynomial used in the equation for calculating the function h.

Figure 4:
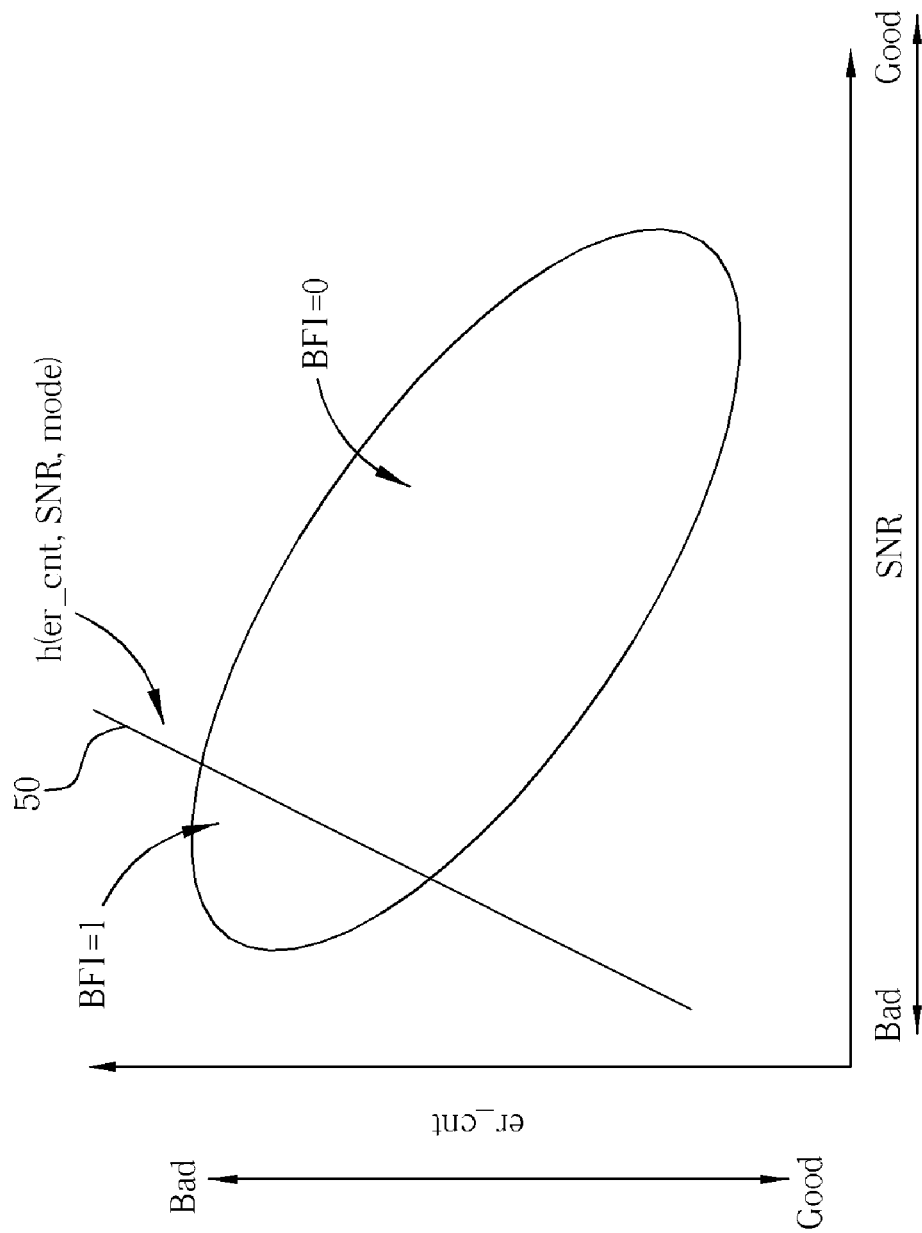
FIG. 4 is a graph for illustrating the basic idea of BFI determination.

The idea can be interpreted through FIG. 4. For simplicity, assume the block quality metric ind is calculated based on the number of erroneous bits er_cnt, the SNR, and the mode information. In this case, a linear function can be used to calculate the block quality metric ind, the result of which is illustrated in line 50. From practice, a bad speech block often occurs when the SNR is low and the number of erroneous bits er_cnt is very large. Thus, a decision boundary is defined to partition a coordinate system defined by the SNR and the number of erroneous bits er_cnt by setting appropriate parameters. If the point (SNR, er_cnt, mode) is located in the upper left portion of the plane or if the CRC result is failed, the current speech block is said to be a bad speech block, and has a BFI equal to 1.

Figure 5:
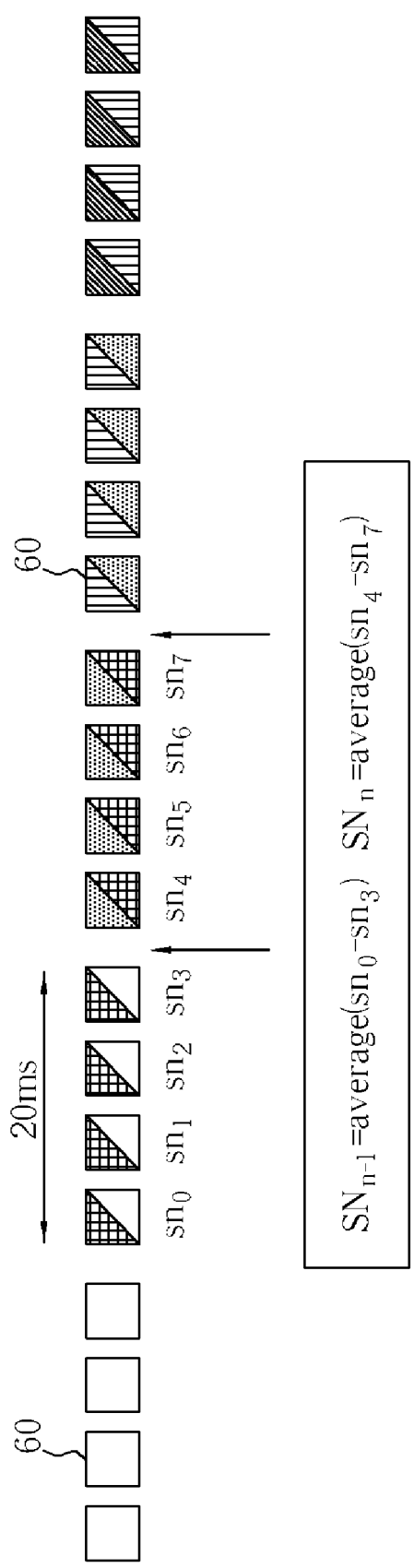
FIG. 5 is a diagram illustrating the burst structure in a GSM system for full rate speech channels.
Figure 6:
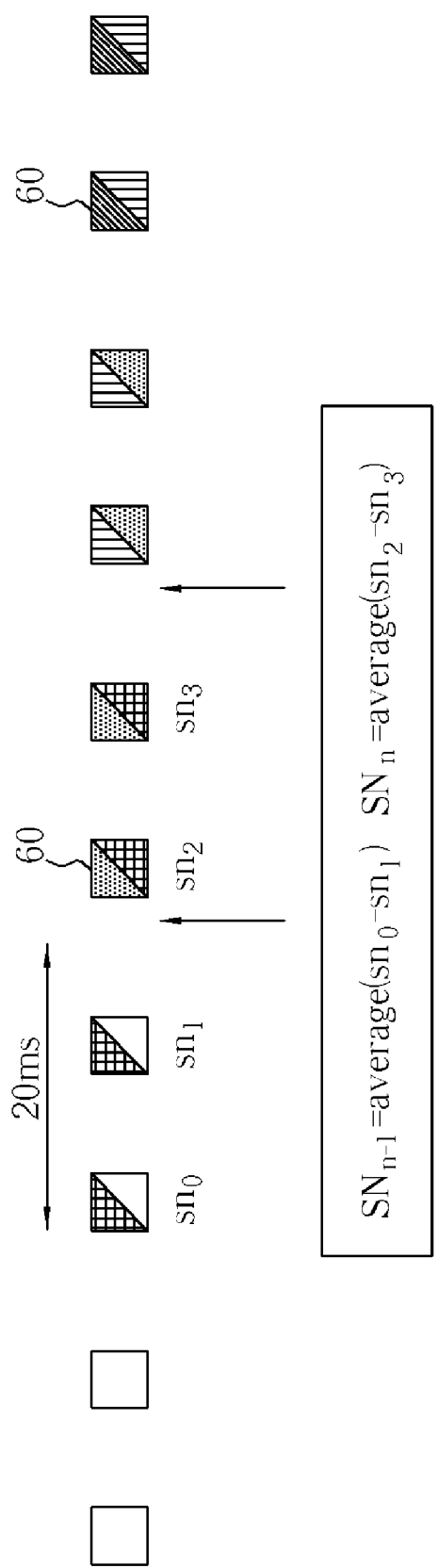
FIG. 6 is a diagram illustrating the burst structure in a GSM system for half rate speech channels.

This idea can be applied to all speech traffic channels, such as full rate (FR), half rate (HR), Adaptive Multi-Rate full speech (AFS), and AMR half speech (AHS). However, for different speech channels, the calculation methods of SNR and threshold settings are different. For full rate (FR and AFS) speech channels, the burst structure can be plotted as shown in FIG. 5. For half rate (HR and AHS) speech channels, the burst structure can be plotted as shown in FIG. 6. Each speech block distributes over K bursts, in which half a burst is occupied, and K=8 for full rate and K=4 for half rate speech channel, respectively. As shown in FIG. 5, four bursts 60 are received in 20 ms, in full rate (FR and AFS) speech channels. On the other hand, FIG. 6 shows that two bursts 60 are received in 20 ms, in half rate (HR and AHS) speech channels. There are many possible ways to calculate signal quality measurements (such as SNR) of a speech block. One possible solution is to average the first K/2 signal quality values and the last K/2 signal quality values individually. Using the SNR as an example, the average estimated signal quality levels are denoted as $SN_{n-1}$ and $SN_n$, which correspond to the previous block and current block, respectively. The alternative ways to derive the signal quality of a block are not limited.

Depending on whether the received block is DTX mode or active mode, the signal quality measurements (such as SNR) of a speech block are calculated differently. In some speech channel protocols, control signals can be used to indicate the start and stop of speech transmission, which also provides an indication of the mode information. However, in other speech channel protocols, such as FR and HR, there is no explicit information given about whether the current mode is active mode or DTX mode. Therefore, while determining the BFI values of speech blocks, a mode transition may be encountered, either a DTX mode to active mode transition or an active mode to DTX mode transition.

Figure 7:
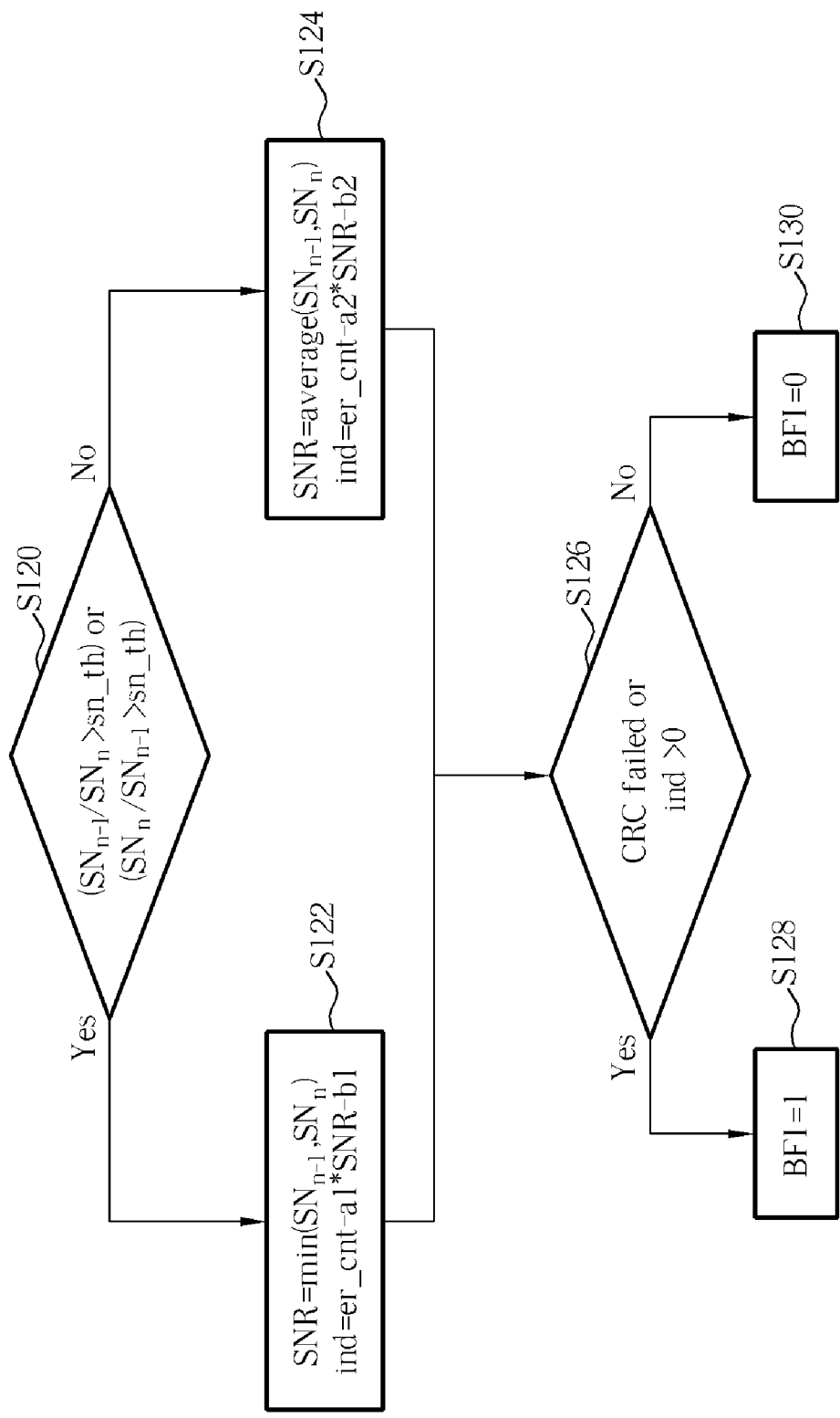
FIG. 7 is a flow chart illustrating determining the BFI decision for FR and HR.

When a mode transition occurs, the SNR values $SN_{n-1}$ and $SN_n$ vary significantly. For example, one value is very small and the other may be large. FIG. 7 is a flow chart illustrating determining the BFI decision for FR and HR. Step S120 in FIG. 7 illustrates that if either of the quotients $SN_{n-1}/SN_n$ or $SN_n/SN_{n-1}$ is greater than a threshold value sn_th, then a mode transition is detected. When the mode transition is detected, step S122 is followed. In this case, the block contains no speech information, so this block is classified as a bad speech block. Therefore, the SNR value of the speech block should be set to be the minimum SNR value of the SNR values $SN_{n-1}$ and $SN_n$ to prevent DTX information from being regarded as good speech. The block quality metric ind is then set to be equal to er_cnt−a1*SNR−b1, where a1 and b1 are coefficient values used for calculating the block quality metric ind in the DTX mode. Otherwise, if neither of the quotients $SN_{n-1}/SN_n$ or $SN_n/SN_{n-1}$ is greater than a threshold value sn_th, then no mode transition is detected and step S124 is followed. In the active mode, the SNR value of the speech block should be set to be the average of the SNR values $SN_{n-1}$ and $SN_n$ to prevent good speech from being regarded as bad speech. The block quality metric ind is then set to be equal to er_cnt−a2*SNR−b2, where a2 and b2 are coefficient values used for calculating the block quality metric ind in the active mode. Therefore, both the current signal quality measurement (such as the SNR value) and the block quality metric ind of the received speech block are calculated according to the mode information. After steps S122 and S124, additional steps S126 to S130 are performed. Here, besides checking the block quality metric ind, to improve the BFI detection accuracy, the step S126 can further check the CRC value. In this embodiment, the BFI value is set to be equal to 1 if either the CRC is failed or if the block quality metric ind is greater than 0, or the BFI value is set to be equal to 0 otherwise. It should be noted that the block quality metric ind er_cnt−a1*SNR−b1 or er_cnt−a2*SNR−b2 is only an example. Any combinations of er_cnt and SNR should be covered in the present invention.

Figure 8:
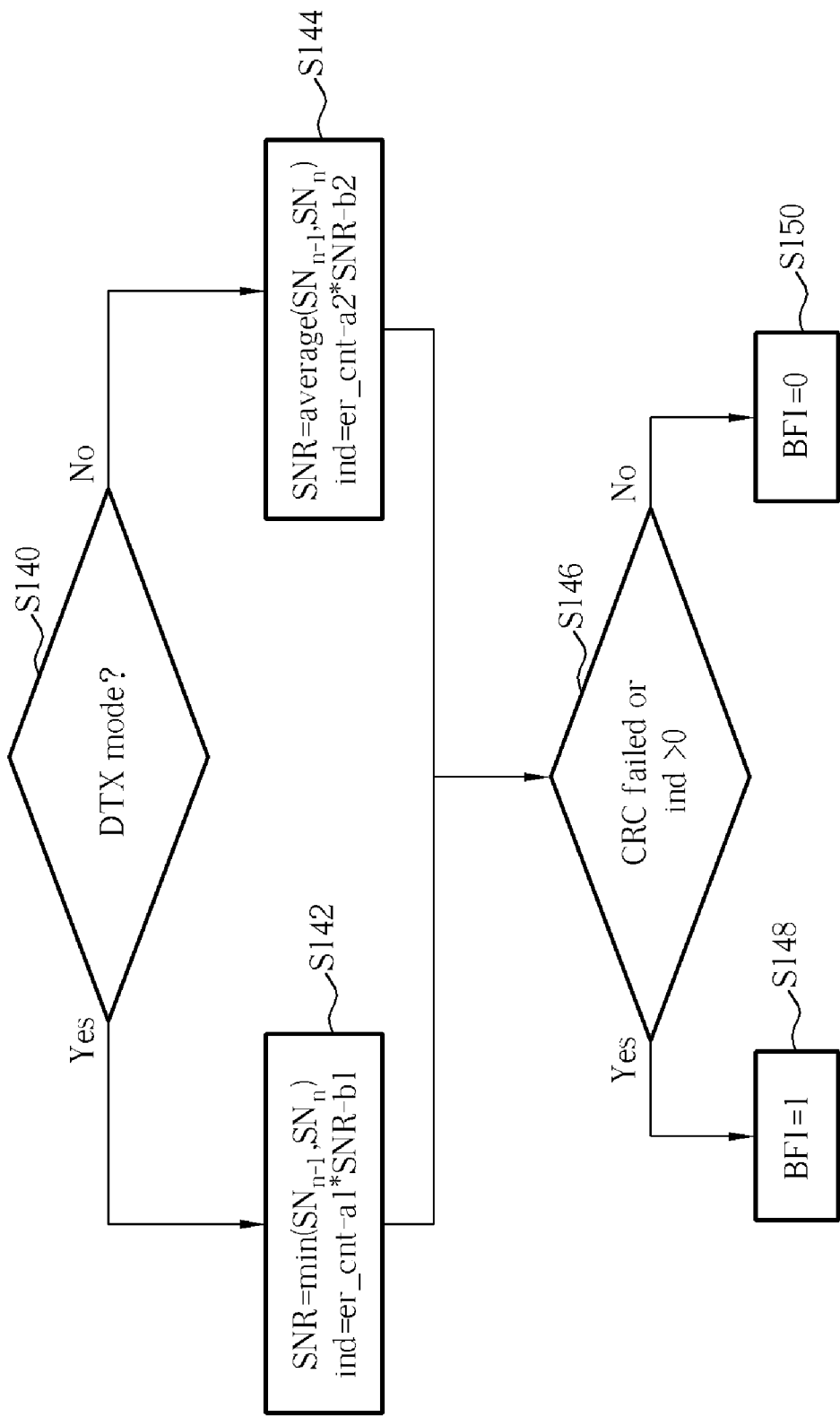
FIG. 8 is a block diagram illustrating the BFI decision for the AMR, including AMR full speech (AFS) and AMR half speech (AHS).

FIG. 8 is a block diagram illustrating the BFI decision for the AMR, including AMR full speech (AFS) and AMR half speech (AHS). In step S140, explicit information about the transition between the active and DTX mode can be read from a fixed pattern of an identification marker (IM) in AMR. By directly reading the mode information, the calculation of quotients $SN_{n-1}/SN_n$ or $SN_n/SN_{n-1}$ in step S120 can be omitted in this embodiment. First, we need to identify these IM patterns and recognize the type, which the IM is belonged to. Besides identifying the silence descriptor and FACCH based on its IM pattern and stealing flags respectively, the marker SID_FIRST and ONSET stand for the end of active period and the start of active period. That means the receiver can distinguish DTX mode from active mode or identify whether the previous block and current block are located in the DTX mode or active mode. Therefore, no calculations have to be done to determine if there has been a mode transition or not, as was the case in step S120 of FIG. 7. If the current mode is DTX mode, step S142 is followed. If the current mode is active mode, step S144 is followed. Steps S142 to S150 are identical to steps S122 to S130, respectively, and will not be further described.

It should be noted that in the present invention, determination of the BFI value can also be performed only according to the block quality metric ind, and without considering the CRC value. In this case, if the block quality metric ind is greater than 0, then the BFI value is set to be equal to 1, and the BFI value is set to be equal to 0 otherwise. Additionally, mode detection can also be performed in other ways. For example, if a predetermined number of consecutive bad blocks are received, such as 5 blocks, it can be concluded that the received block is DTX mode.

In summary, different decision boundaries and methods for calculating the block quality metric are proposed for different conditions, which depend on the traffic channels and the mode informations. These adaptive schemes for calculating the block quality metric and the selection of thresholds can lower the undetected bad frame ratio and prevent good speech blocks from being regarded as bad. The speech quality can then be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a receiver to determine a bad frame indication (BFI) of a received speech block, the method comprising steps of:
   estimating the number of erroneous bits of the received speech block;
   determining a mode information of the received speech block comprising:
      receiving SNR values corresponding to each burst of the speech block;
      averaging the SNR values corresponding to the bursts in the current speech block and a previous speech block immediately preceding the current speech block to produce a current SNR value and a previous SNR value; and
      determining a mode transition has occurred by checking if the quotient of the previous SNR value divided by the current SNR value is greater than a predetermined value or if the quotient of the current SNR value divided by the previous SNR value is greater than the predetermined value;
   calculating a signal quality measurement of the received speech block;
   calculating a block quality metric according to the mode information, wherein the block quality metric is related to both the number of erroneous bits and the signal quality measurement; and
   setting the BFI of the received speech block according to the block quality metric.

2. The method of claim 1, wherein estimating the number of erroneous bits of the received speech block comprises:
   decoding speech information bits of the received speech block;
   re-encoding the decoded speech information bits; and
   calculating the number of erroneous bits by comparing the received speech information bits with the corresponding decoded and re-encoded speech information bits.

3. The method of claim 1, wherein calculating the signal quality measurement comprises calculating a signal-to-noise ratio (SNR) of the received speech block.

4. The method of claim 3, wherein calculating the SNR of the received speech block comprises:
   receiving SNR values corresponding to each burst of the speech block;
   averaging the SNR values corresponding to the bursts in the current speech block and a previous speech block immediately preceding the current speech block to produce a current SNR value and a previous SNR value; and selecting the minimum of the current SNR value and the previous SNR value to be the SNR of the received speech block.

5. The method of claim 3, wherein calculating the SNR of the received speech block comprises:

receiving SNR values corresponding to each burst of the speech block;

averaging the SNR values corresponding to the bursts in the current speech block and a previous speech block immediately preceding the current speech block to produce a current SNR value and a previous SNR value; and setting the SNR of the received speech block to be equal to the average of the current SNR value and the previous SNR value.

6. The method of claim 1, wherein determining the mode information of the received speech block comprises:

determining whether the received speech block is in discontinuous transmission (DTX) mode by checking an identification marker of the received speech block.

7. The method of claim 1, wherein calculating the block quality metric is performed according to the equation:

$$ind = er\_cnt - a1 * SNR0 - b1,$$

where ind represents the block quality metric, er_cnt represents the number of erroneous bits, a1 is a first coefficient, SNR0 represents the signal-to-noise ratio of the received speech block, and b1 is a second coefficient.

8. The method of claim 1, wherein calculating the signal quality measurement comprises calculating the power of estimated channel coefficients that correspond to the received speech block.

9. The method of claim 1, wherein determining the mode information of the received speech block comprises:

counting the number of previous received consecutive bad blocks;

concluding that the received speech block is in DTX mode upon receiving a predetermined number of consecutive bad blocks.

10. The method of claim 1, further comprising:

checking a cyclic redundancy code (CRC) corresponding to the received speech block that indicates whether the speech block passes or fails a CRC error detection.

11. The method of claim 1, wherein the setting the BFI of the received speech block comprises setting the BFI of the received speech block according to the block quality metric and the CRC error detection.

12. A mobile station receiver for determining a bad frame indication (BFI) of a received speech block, comprising:

an error calculation circuit for estimating the number of erroneous bits of the received speech block;

a signal quality calculation circuit for calculating a signal quality measurement of the received speech block; and a BFI determining circuit, for determining a mode information of the received speech block; for calculating a block quality metric according to the mode information, wherein the block quality metric is related to both the number of erroneous bits and the signal quality measurement; and for setting the BFI of the received speech block according to the block quality metric, wherein when determining the mode information of the received speech block the BFI determining circuit receives SNR values corresponding to each burst of the speech block, averages the SNR values corresponding to the bursts in the current speech block and a previous speech block immediately preceding the current speech block to produce a current SNR value and a previous SNR value, and determines a mode transition has occurred by checking if the quotient of the previous SNR value divided by the current SNR value is greater than a predetermined value or if the quotient of the current SNR value divided by the previous SNR value is greater than the predetermined value.

13. The mobile station receiver of claim 12, wherein the error calculation circuit comprises:

a channel decoder for decoding speech information bits of the received speech block; and a re-encoder for re-encoding the decoded speech information bits;

wherein the error calculation circuit compares the received speech information bits with the corresponding decoded and re-encoded speech information bits to calculate the number of erroneous bits.

14. The mobile station receiver of claim 12, wherein the signal quality measurement is a signal-to-noise ratio (SNR) of the received speech block.

15. The mobile station receiver of claim 14, wherein the signal quality calculation circuit receives SNR values corresponding to each burst of the speech block, averages the SNR values corresponding to the bursts in the current speech block and a previous speech block immediately preceding the current speech block to produce a current SNR value and a previous SNR value, and selects the minimum of the current SNR value and the previous SNR value to be the SNR of the received speech block.

16. The mobile station receiver of claim 14, wherein the signal quality calculation circuit receives SNR values corresponding to each burst of the speech block, averages the SNR values corresponding to the bursts in the current speech block and a previous speech block immediately preceding the current speech block to produce a current SNR value and a previous SNR value, and sets the SNR of the received speech block to be equal to the average of the current SNR value and the previous SNR value.

17. The mobile station receiver of claim 12, wherein the BFI determining circuit determines whether the received speech block is in discontinuous transmission (DTX) mode by checking an identification marker of the received speech block.

18. The mobile station receiver of claim 12, wherein the block quality metric is calculated according to the equation:

$$ind = er\_cnt - a1 * SNR0 - b1,$$

where ind represents the block quality metric, er_cnt represents the number of erroneous bits, a1 is a first coefficient, SNR0 represents the signal-to-noise ratio of the received speech block, and b1 is a second coefficient.

19. The mobile station receiver of claim 12, wherein the BFI determining circuit counts the number of previous received consecutive bad blocks and concludes that the received speech block is in DTX mode upon receiving a predetermined number of consecutive bad blocks.

20. The mobile station receiver of claim 12, further comprising a parity check circuit for checking a cyclic redundancy code (CRC) corresponding to the received speech block that indicates whether the speech block passes or fails a CRC error detection.

21. The mobile station receiver of claim 12, wherein the BFI determining circuit sets the BFI of the received speech block according to the block quality metric and the CRC error detection.

* * * * *